US012230311B2

(12) United States Patent
Gieske et al.

(10) Patent No.: US 12,230,311 B2
(45) Date of Patent: Feb. 18, 2025

(54) ALIASED ROW HAMMER DETECTOR

(71) Applicant: Micron Technology, Inc., Boise, ID (US)

(72) Inventors: Edmund Gieske, Boise, ID (US); Cagdas Dirik, Boise, ID (US); Robert M. Walker, Boise, ID (US); Sujeet Ayyapureddi, Boise, ID (US); Niccolo Izzo, Boise, ID (US); Markus Geiger, Boise, ID (US); Yang Lu, Boise, ID (US); Ameen Akel, Boise, ID (US); Elliott C. Cooper-Balis, Boise, ID (US); Danilo Caraccio, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 17/941,655

(22) Filed: Sep. 9, 2022

(65) Prior Publication Data

US 2023/0238046 A1 Jul. 27, 2023

Related U.S. Application Data

(60) Provisional application No. 63/302,051, filed on Jan. 22, 2022.

(51) Int. Cl.
*G11C 7/00* (2006.01)
*G11C 11/406* (2006.01)
*G11C 29/52* (2006.01)

(52) U.S. Cl.
CPC ... *G11C 11/40618* (2013.01); *G11C 11/40611* (2013.01); *G11C 29/52* (2013.01)

(58) Field of Classification Search
CPC ......... G11C 11/40618; G11C 11/40611; G11C 29/52; G11C 29/023; G11C 29/028; G11C 29/44; G11C 29/50016; G11C 2029/0409
USPC ...................................................... 365/222
See application file for complete search history.

(56) References Cited

U.S. PATENT DOCUMENTS 9,607,678 B2 * 3/2017 Oh .................... G11C 11/40618
11,615,861 B2 * 3/2023 Kim ....................... G11C 29/42
365/185.09

\* cited by examiner

*Primary Examiner* — Tha-Oh Bui
(74) *Attorney, Agent, or Firm* — Wood IP LLC; Theodore A. Wood

(57) ABSTRACT

An energy-efficient and area-efficient, mitigation of errors in a memory media device that are caused by row hammer attacks and the like is described. The detection of errors is deterministically performed while maintaining, in an SRAM, a number of row access counters that is smaller than the total number of rows protected in the memory media device. The reduction of the number of required counters is achieved by aliasing a plurality of rows that are being protected to each counter. The mitigation may be implemented on a per-bank basis, per-channel basis or per-memory media device basis. The memory media device may be DRAM.

19 Claims, 16 Drawing Sheets

Example Total ACT Counter Table Row Hammer Detector Size

| ACT Counters Alias Factor | Total ACT Counter Table Words (Counters) Required for 128M Uniquely Addressable Memory Media Rows (ACT Counters are typically 12 bits each) | |
|---|---|---|
| | Media Periodic Refresh Aware (with additional array word clear/write) | Optional Ping-Pong (as shown, w/ flash clear each $t_{REF}$ ~64mS) |
| 1 (perfect, no aliasing) | 134,217,728 | 268,435,456 |
| 4 | 33,554,432 | 67,108,864 |
| 8 | 16,777,216 | 33,554,432 |
| 16 | 8,388,608 | 16,777,216 |
| 32 | 4,194,304 | 8,388,608 |

FIGURE 6B

| Row Hammer Response | Data Integrity Assured | Needs Media Repair Mgmt | Required Time to Response | Impact Granularity |
|---|---|---|---|---|
| Bias Cache Replacement | < associativity | No | 0 | Cache set |
| Increased Refresh | No | No | ~300nS ($t_{RFC}$) | Logical Bank |
| ACT/PRE Neighbor Rows | Yes | Yes | ≥90nS (2x $t_{RC}$) | ≥2 Rows |
| Poor-man's dRFM | Yes | No | 1uS (2x-5x RFM+$t_{RC}$) | ≥1 Rows |
| dRFM | Yes | No | 200nS | ≥1 Rows |
| EDAC Scrub Neighbors ** | Yes++ | Yes | ≥5uS? (4x $t_{RC}$+256x $t_{CCD}$) | ≥2 Rows |
| Throttle ACTs to CRHA Rows | Yes | No | ≥10uS (allowed ACT rate) | ≥1 Rows |
| Respond w/ Data_Bad | Yes | No | 0 | ≥1 Rows |
| Alert (interrupt) Host OS | w/ other | No | >100uS on host | ≥1 Rows |

FIGURE 10

ALIASED ROW HAMMER DETECTOR

CROSS-REFERENCE TO RELATED APPLICATIONS

This application claims priority from U.S. Provisional Application No. 63/302,051, filed Jan. 22, 2022, the contents of which are hereby incorporated by reference. Additionally, this application is related to the following commonly assigned U.S. Pat. No. 11,994,990, issued May 28, 2024, U.S. Publication No. US20230237152A1, published Jul. 27, 2023, U.S. Pat. No. 12,119,043, issued Oct. 15, 2024, U.S. Publication No. US20230236735A1, published Jul. 27, 2023, U.S. Pat. Nos. 12,086,459, 11,977,769, issued May 7, 2024, and U.S. Publication No. US20230236757A1, published Jul. 27, 2023, the contents of each of which is hereby incorporated by reference.

FIELD OF TECHNOLOGY

The present disclosure relates to deterministic detection of row hammer errors in memory media.

BACKGROUND

Memory devices (also referred to as "memory media devices") are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory may maintain their programmed states for the duration of the system being powered on. Non-volatile memory cells (e.g., NAND memory cells) may maintain their programmed states for extended periods of time even in the absence of an external power source.

Memory devices may be coupled to a host (e.g., a host computing device) to store data, commands, and/or instructions for use by the host while the computer or other electronic system is operating. For example, data, commands, and/or instructions can be transferred between the host and the memory device(s) during operation of a computing or other electronic system. A controller, referred to as a "memory controller", may be used to manage the transfer of data, commands, and/or instructions between the host and the memory devices.

BRIEF DESCRIPTION OF THE DRAWINGS

FIG. 6B illustrates a table showing the effect of aliasing factors on the size of aliased row activation counter tables, according to some example embodiments.

FIG. 10 illustrates a table of different row hammer attack responses that can be implemented, according to some example embodiments.

DETAILED DESCRIPTION

This disclosure describes systems, apparatuses, and methods related to a detector for memory media soft errors, such as, for example, row hammer errors. The detector, sometimes referred to herein as a row hammer detector, is configured to perform deterministic detection of row hammer attacks in DRAM media in an energy efficient and space efficient manner.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

In some embodiments, the row hammer detector is located in a "memory controller". The memory controller can orchestrate performance of operations to write data to at least one of multiple types of memory devices.

Figure 1A:
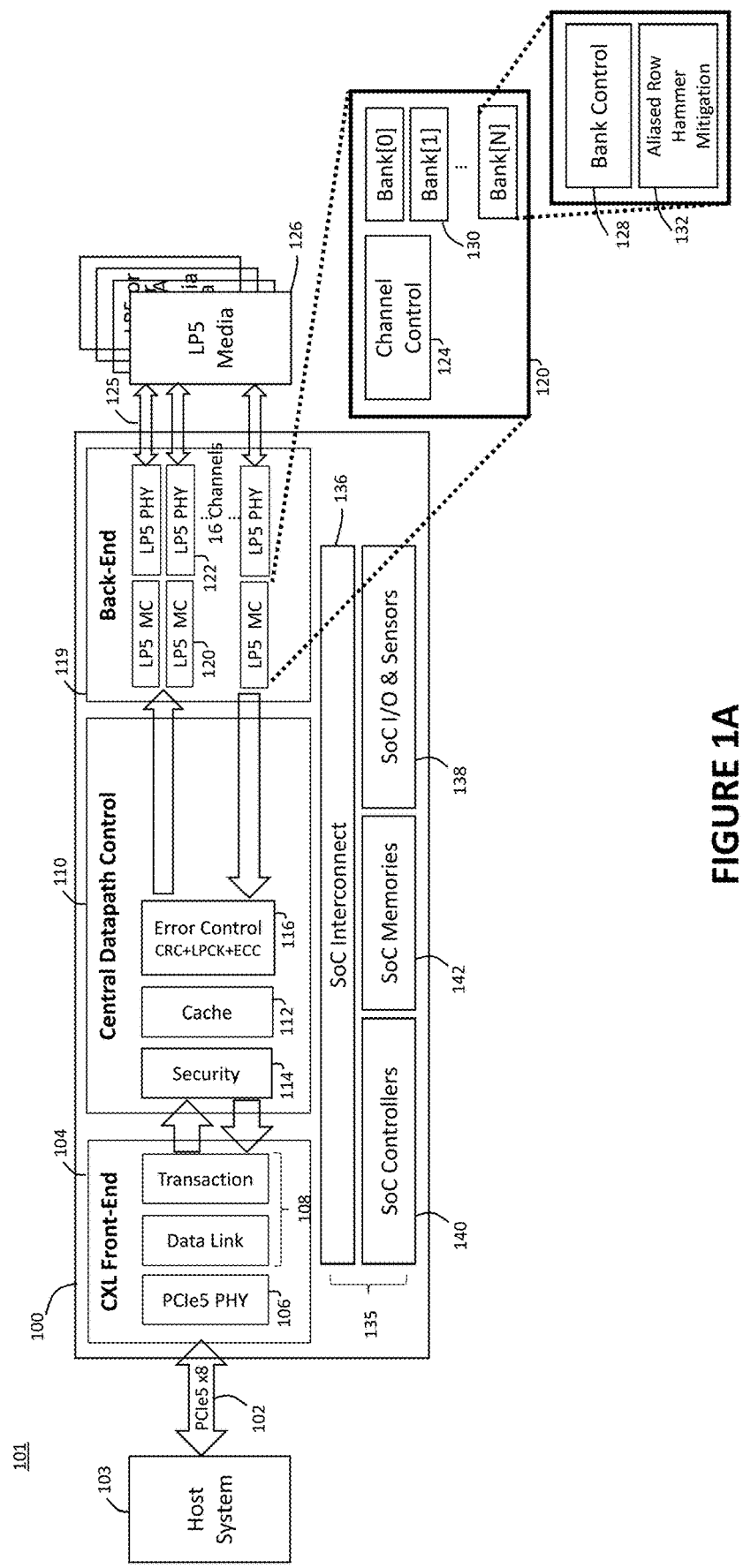
FIGS. 1A-1C illustrates an example functional block diagram in the form of a computing system including a memory controller configured for detecting row hammer attacks using aliased row activation counters in accordance with some example embodiments of the present disclosure.

FIG. 1A illustrates an example functional block diagram in the form of a computing system 101 including a memory controller 100 configured for detecting row hammer attacks in accordance with some embodiments of the present disclosure. The computing system 101 can detect and mitigate row hammer attacks on one or more memory devices 126. The memory controller 100 comprises a front end portion 104, a central controller portion 110, a back end portion 119, and a management unit 135. The memory controller 100 can be coupled to a host 103 (i.e., host system 103) and memory device 126. In some embodiments, memory device 126 may be a DRAM device.

The front end portion 104 includes an interface 106 to couple the memory controller 100 to the host 103 through one or more input/output (I/O) lanes 102. The communications over I/O lanes 102 may be according to a protocol such as, for example, Peripheral Component Interconnect Express (PCIe). In some embodiments, the plurality of I/O lanes 102 can be configured as a single port. Example embodiments are not limited by the number of I/O lanes, whether or not the I/O lanes belong to a single port, or the communication protocol for communicating with the host.

The interface 106 receives data and/or commands from host 103 through I/O lanes 102. In an embodiment, the interface 106 is a physical (PHY) interface configured for PCIe communications. The front end portion 104 may include interface management circuitry 108 (including data link and transaction control) which may provide higher layer protocol support for communications with host 103 through PHY interface 106.

The central controller portion 110 is configured to control, in response to receiving a request or command from host 103, performance of a memory operation. The memory operation can be a memory operation to read data from, or write data to, memory device 126. The central controller portion 110 may comprise a cache memory 112 to store data associated with the performance of the memory operation, a security component 114 configured to encrypt the data before storing, and to decrypt data after reading, the data in memory device 126.

In some embodiments, in response to receiving a request from host 103, data from host 103 can be stored in cache lines of cache memory 112. The data in the cache memory can be written to memory device 126. An error correction component 116 is configured to provide error correction to data read from and/or written to memory device 126. In some embodiments, the data can be encrypted using an encryption protocol such as, for example, Advanced Encryption Standard (AES) encryption, before the data is stored in the cache memory. In some embodiments, the central controller portion 110 can, in response to receiving a request from host 103, control writing of multiple pages of data substantially simultaneously to memory device 126.

The management unit 135 is configured to control operations of the memory controller 100. The management unit may recognize commands from the host 103 and accordingly manage the one or more memory devices 126. In some embodiments, the management unit 135 includes an I/O bus 138 to manage out-of-band data, a management unit controller 140 to execute a firmware whose functionalities include, but not limited to, monitoring and configuring the characteristics of the memory controller 100, and a management unit memory 142 to store data associated with memory controller 100 functionalities. The management unit controller 140 may also execute instructions associated with initializing and configuring the characteristics of the memory controller 100. An endpoint of the management unit 135 can be exposed to the host system 103 to manage data through a communication channel using the I/O bus 138.

A second endpoint of the management unit 135 can be exposed to the host system 103 to manage data through a communication channel using interface 106. In some embodiments, the characteristics monitored by the management unit 135 can include a voltage supplied to the memory controller 100 or a temperature measured by an external sensor, or both. Further, the management unit 135 can include a local bus interconnect 136 to couple different components of the memory controller 100. In some embodiments, the local bus interconnect 136 can include, but is not limited to, an advanced high performance bus (AHB).

The management unit 135 can include a management unit controller 140. In some embodiments, the management unit controller 140 can be a controller that meets the Joint Test Action Group (JTAG) standard and operate according to an Inter-Integrate Circuit (I2C) protocol, and auxiliary I/O circuitry. As used herein, the term "JTAG" generally refers to an industry standard for verifying designs and testing printed circuitry boards after manufacture. As used herein, the term "I2C" generally refers to a serial protocol for a two-wire interface to connect low-speed devices like microcontrollers, I/O interfaces, and other similar peripherals in embedded systems.

The back end portion 119 is configured to couple to one or more types of memory devices (e.g., DRAM media 126) via (e.g., through) a plurality of channels 125, which can be used to read/write data to/from the memory devices 126, to transmit commands to memory device 126, to receive status and statistics from memory device 126, etc. The management unit 135 can couple, by initializing and/or configuring the memory controller 100 and/or the memory device 126 accordingly, the memory controller 100 to external circuitry or an external device, such as host 103 that can generate requests to read or write data to and/or from the memory device(s). The management unit 135 is configured to recognize received commands from the host 103 and to execute instructions to apply a particular operation code associated with received host commands for each of a plurality of channels coupled to the memory device 126.

The back end portion 119 includes a media controller portion comprising a plurality of media controllers 120 and a PHY layer portion comprising a plurality of PHY interfaces 122. In some embodiments, the back end portion 119 is configured to couple the PHY interfaces 122 to a plurality of memory ranks of the memory device 126. Memory ranks can be connected to the memory controller 100 via a plurality of channels 125. A respective media controller 120 and a corresponding PHY interface 122 may drive a channel 125 to a memory rank. In some embodiments, each media controller 120 can execute commands independent of the other media controllers 120. Therefore, data can be transferred from one PHY interface 122 through a channel 125 to memory device 126 independent of other PHY interfaces 122 and channels 125.

Each PHY interface 122 may operate in accordance with a PHY layer that couples the memory controller 100 to one or more memory ranks in the memory device 126. As used herein, the term PHY layer generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can be a plurality of channels 125.

As used herein, the term "memory ranks" generally refers to a plurality of memory chips (e.g., DRAM memory chips) that can be accessed simultaneously. In some embodiments, a memory rank can be sixty-four (64) bits wide and each memory rank can have eight (8) pages. In some embodiments, a page size of a first type of memory device can be larger than a page size of the second type of memory device. Example embodiments, however, are not limited to particular widths of memory ranks or page sizes.

Each media controller 120 may include a channel control circuitry 124 and a plurality of bank control circuitry 128 where a respective one of the plurality of bank control circuitry 128 is configured to access a respective bank 130 of the plurality of banks on the media device 126 accessed by the respective media controller 120. As described in more detail below a memory error detector, or more particularly a respective per-bank row hammer mitigation circuitry 132, is configured for each bank 120 in each channel in embodiments of this disclosure.

Rank, channel, and bank can be considered hardware-dependent logical groupings of storage locations in the media device. The mapping of rank, channel and bank logical groupings to physical storage locations or rows in the memory device 126 may be preconfigured or may be configurable in some embodiments by the memory controller in communication with the memory device 126.

In some embodiments, the memory controller 100 can be a Compute Express Link™ (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. When the memory controller 100 is CXL compliant, the interface management circuitry 108 (including data link and transaction control 108) may use CXL protocols to manage the interface 106 which may comprise PCIe PHY interfaces.

According to some embodiments, the memory device 126 includes one or more DRAM devices. In some embodiments, main memory is stored in DRAM cells that have high storage density. DRAM cells lose their state over time. That is, the DRAM cells must be refreshed periodically, hence the name "Dynamic". DRAM can be described as being organized according to a hierarchy of storage organization comprising DIMM, rank, bank, and array. A DIMM comprises a plurality of DRAM chips, and the plurality of chips in a DIMM are organized into one or more "ranks". Each chip is formed of a plurality of "banks". A bank is formed of one or more "rows" of the array of memory cells. All banks within the rank share all address and control pins. All banks are independent, but in some embodiments only one bank in a rank can be accessed at a time. Because of electrical constraints, only a few DIMMs can be attached to a bus. Ranks help increase the capacity on a DIMM.

Multiple DRAM chips are used for every access to improve data transfer bandwidth. Multiple banks are provided so that the computing system can be simultaneously working on different requests. To maximize density, arrays within a bank are made large, rows are wide, and row buffers are wide (8 KB read for a 64B request). Each array provides a single bit to the output pin in a cycle (for high density and because there are few pins). DRAM chips are often described as xN, where N refers to the number of output pins; one rank may be composed of eight x8 DRAM chips (e.g., the data bus is 64 bits). Banks and ranks offer memory parallelism, and the memory controller 100 may schedule memory accesses to maximize row buffer hit rates and bank/rank parallelism.

In the embodiment illustrated in FIG. 1A, the memory device 126 is low power double data rate (LPDDR) LP5 or other similar memory interfaces. However, embodiments are not limited thereto, and memory device 126 may comprise one or more memory media of any memory media types, such as, but not limited to, types of DRAM, that are subject to row hammer attacks or similar memory attacks.

Each of the plurality of media controllers 120 can receive a same command and address and drive the plurality of channels 125 substantially simultaneously. By using the same command and address for the plurality of media controllers, each of the plurality of media controllers 120 can utilize the plurality of channels 125 to perform the same memory operation on the same plurality memory cells. Each media controller 120 can correspond to a RAID component. As used herein, the term "substantially" intends that the characteristic needs not be absolute, but is close enough so as to achieve the advantages of the characteristic.

For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces (e.g., LPDDR5 vs. PCIe), media controllers that are utilized "substantially simultaneously" may not start or finish at the same time. For example, the multiple memory controllers can be utilized such that they are writing data to the memory devices at the same time, regardless if one of the media controllers commences or terminates prior to the other.

In FIG. 1A, the row hammer mitigation component 132 is implemented at the per-bank level in memory controller 100 in the system 101. In the contrast, in the memory controller 100' of system 101' shown in FIG. 1B, the row hammer mitigation component 132 is implemented at the per-channel level. Alternatively, in the memory controller 100" in system 101" shown in FIG. 1C, the row hammer mitigation component is implemented at the memory media device level.

Figure 2A:
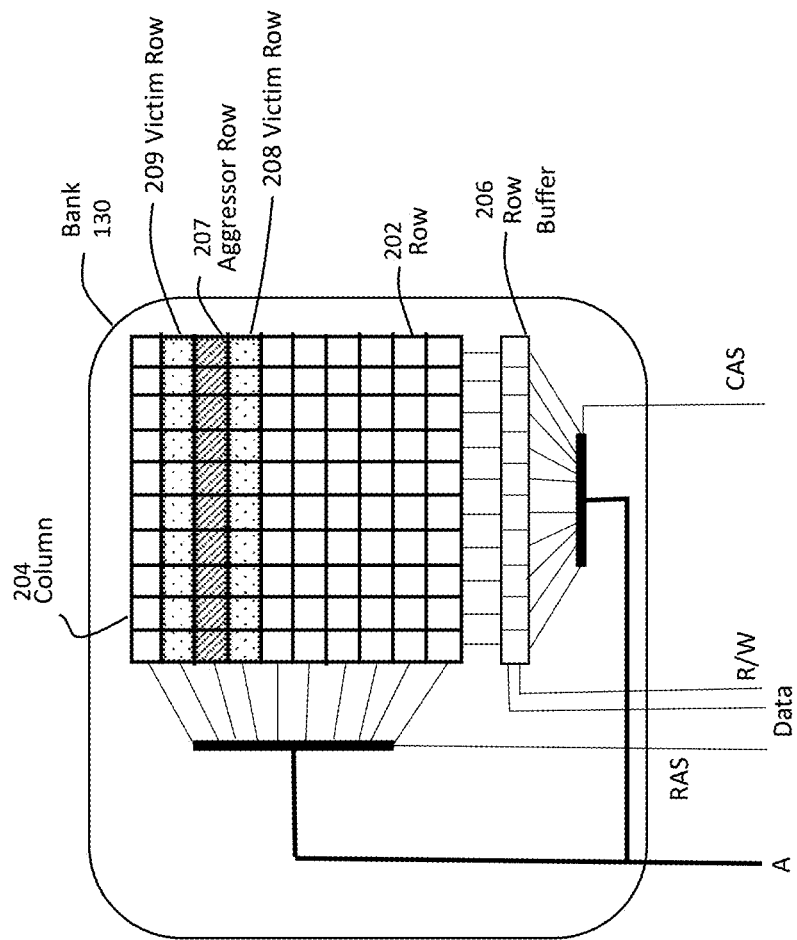
FIG. 2A illustrates a schematic view of a memory bank in a DRAM media device.

FIG. 2A illustrates a schematic view of a memory bank 130 viewed in a DRAM device such as memory device 126. The illustrated bank 130 represents an 10×10 array of cells organized in 10 rows (e.g., row 202) and 10 columns (e.g., column 204). The bank is stored to or read from, one row at a time, via a row buffer 206. Each cell in the array is accessed by providing a row address and a column address. The address bus, a row access strobe signal, a column access strobe signal (shown in FIG. 2A as A, RAS, CAS, respectively) are used to access particular memory locations in the array. The row buffer 206 and the data or read/write signals are used for the data to be read from or stored to memory locations.

In some memory devices, a counter, not shown in FIG. 2A, may be associated with a row to keep track of the number of times that row has been activated during a particular time interval. For example, the counter may be initialized at the beginning of each refresh interval and be incremented for each access to that row during that refresh interval. In conventional perfect tracking implementations, a respective counter was associated with each row. In example embodiments, the number of counters maintained is much smaller than the total number of rows in the memory device(s) attached to the memory controller.

Figure 2B:
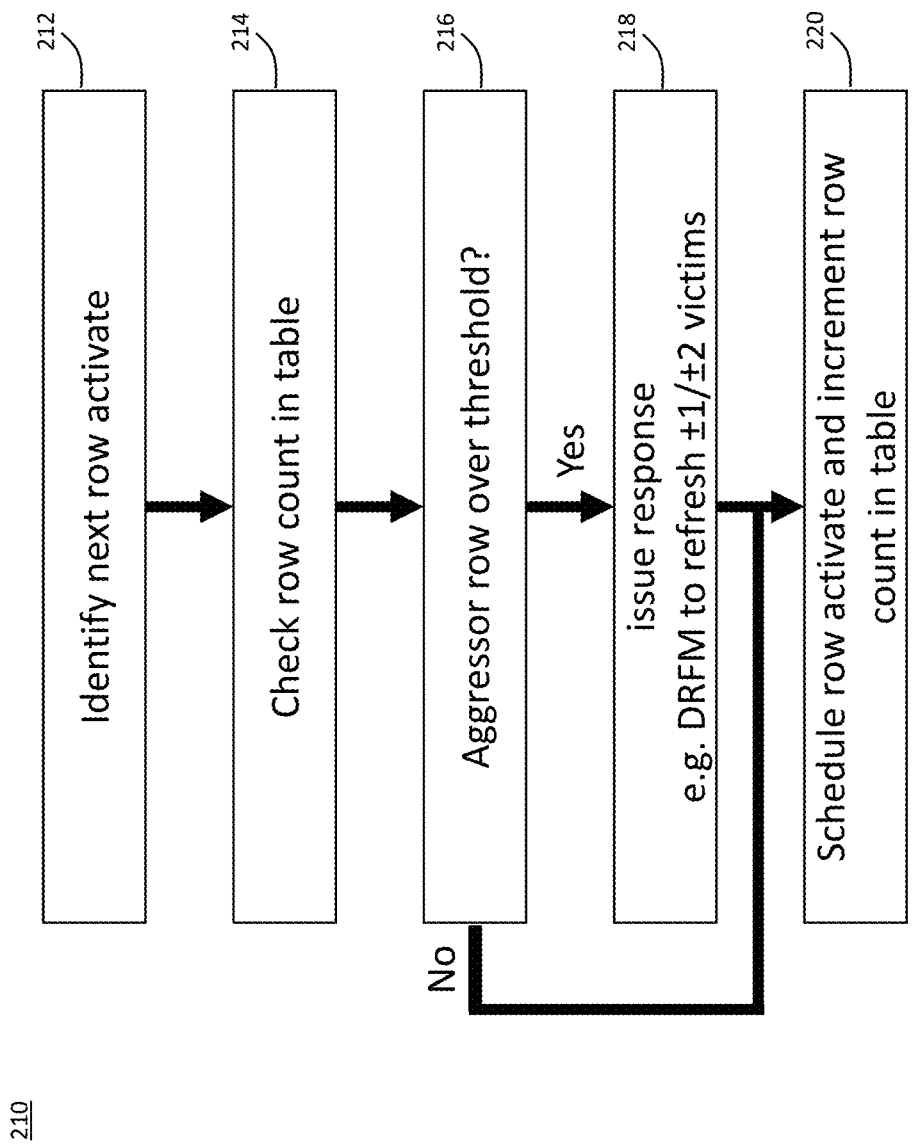
FIG. 2B illustrates a flowchart depicting a basic implementation flow of row hammer mitigation.

FIG. 2B illustrates a flowchart 210 depicting a basic implementation flow of row hammer mitigation. Row hammer mitigation includes two aspects: the first aspect is row hammer detection, and the second aspect is the response to that detection. A variety of responses are possible, with a response commanding the memory device 126 to refresh victim rows (e.g., DRFM response) being one of the possible responses to mitigate or eliminate the effects of row hammer effects. In some instances, the memory controller transmits a refresh command, such as a DRFM response, to the memory device 126 and specifies the aggressor row, and the memory device's internal circuitry determines the victim rows to be refreshed based on the aggressor row identified by the memory controller and refreshes the victim rows.

When a request is received to access a row, which may be referred to as the "aggressor row" (row 207 in FIG. 2A) in this disclosure, in the memory device 126, at operation 212 that row is identified as the next row to activate. At operation 214, a value of a counter configured to keep track of the number of accesses to the aggressor row in a predetermined time period is checked. At operation 216, it is determined whether the value of the counter is above the RHT. When the RHT is exceeded for the aggressor row 207, the integrity of the data in one or more rows (referred to as "victim rows"; see rows 208 and 209 in FIG. 2A) physically adjacent to the aggressor row 207 cannot be guaranteed. The RHT may be factory set or may be configured at boot time and may depend on the type of the memory media device. If the value is above the RHT, then at operation 218 a response is issued.

One type of response may be a digital refresh management (DRFM) command to refresh the physically adjacent rows (e.g., rows 208 and 209) on either side of the aggressor row 207. When a response is issued at operation 218, the counters of the victim rows (e.g., rows 208 and 209) which are refreshed can be reset (e.g., set to 0). The number of physically adjacent rows to refresh may be preconfigured or may be dynamically determined. After issuing the response at 218, or if at operation 216 it was determined that the aggressor row 207 is not over the RHT, at operation 220, the row activate for the aggressor row is scheduled and the counter for that row is incremented (e.g., incremented by 1).

As noted above, memory device 126 such as, for example, one or more DRAM DIMMs, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in terms of practicality in either energy efficiency and/or space efficiency, the example embodiments of the present disclosure provide a row hammer mitigation technique that provides perfect tracking (i.e. does not allow any false negative row hammer detection) of row hammer attacks in a practical, energy and space efficient manner.

Figure 3:
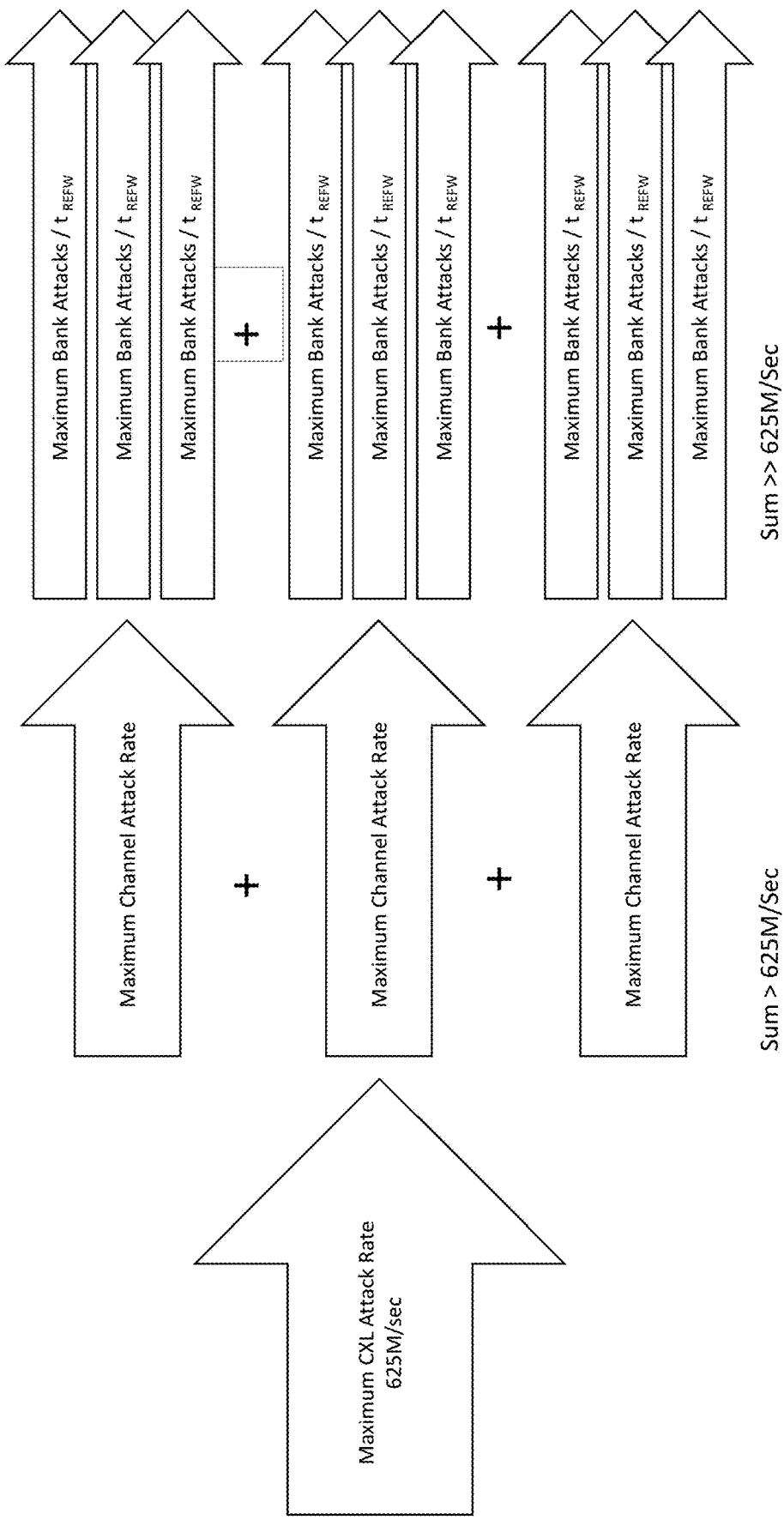
FIG. 3 graphically illustrates an example distribution of row hammer events at the global level in a memory controller, at the channel level and at the bank level.

As shown in FIG. 3, in some example scenarios in which a DRAM memory device is attached to a CXL-compliant memory controller, the global rate of row hammer attacks on the memory device may be about 625 million attacks per second. Thus, if perfect row hammer detection is implemented at the global level for the attached memory device, the row hammer detector must be configured with sufficient counters to detect at least that many attacks occurring in the duration of a second.

For example, in the example embodiment shown in FIG. 1A, if perfect row tracking were to be implemented globally, the central controller 110 could be configured with a row hammer mitigation circuitry that receives row access information for rows in the attached memory device from the media controllers 120 potentially at the rate of 625 million per second, and communicates mitigation responses (e.g., DRFM) to the respective media controllers 120 as needed.

If per-channel row hammer mitigation is implemented for each media controller 120, then the sum of the attack rates that can be handled by the respective media controllers 120 must at least amount to the 625 million/sec, but such an implementation will be capable of, and accordingly use the space and energy resources required, for tracking a substantially higher rate of row updates because the resources are configured on a per channel basis.

Similarly, if per-bank row hammer mitigation is implemented in each bank controller 128 for each bank in a channel, then the sum of attack rates that can be handled by all the bank controllers must at least amount to the 625 million/sec, but such an implementation will be capable of, and accordingly use the space and energy resources required for, detecting a substantially higher detection rate because the resources are configured on a per-bank basis. Thus, the total amount of space and energy resources that may be required to implement row hammer detection at the bank level exceeds the amount of space and energy resources that may be required at the channel level, which in turn exceeds that of the global level implementation.

Thus, various approaches may be considered to achieve perfect (deterministic) row hammer tracking in the memory controller by accessing multiple rows as one unit (same row on different chips) and thus having only one counter for the group, rather than having a counter for each row of the media device.

As noted above, memory device 126 such as, for example, DRAM, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in either energy efficiency and/or space efficiency, the present disclosure provides a row hammer mitigation technique that provides perfect tracking (i.e. does not allow any false negative row hammer detection) of row hammer attacks in practical, energy and space efficient manner.

A motivation for the approach to the solution described for row hammer attacks in this disclosure is that it is very space inefficient to have a separate counter for each and every media row on the media device, and therefore other implementations, having a smaller memory footprint for the counters, are needed to provide a perfect tracking for row hammer detection. Instead of dedicating a respective row hammer activation counter for each row in the media device, the example embodiments in this disclosure alias each counter to represent multiple rows in the media device.

That is, each counter keeps count for a respectively different set of media rows, where the set includes more than one media row. By assigning each counter to keep track of accesses to more than one media row, the total number of counters that is required to be maintained is reduced. Additionally, the counter incrementing and the threshold testing required by example embodiments can be done very efficiently in three clock cycles. The tradeoff to the space saving by having multiple rows per counter instead of one row per counter, is that the shared counter will likely reach the RHT more frequently because a counter is now incremented upon accesses to any of the multiple rows which it is assigned to.

However, since it has been observed that row hammer events are rare (that is, the instances in which the number of accesses to a particular media row exceeding the RHT within a refresh interval is infrequent), the example embodiments seek to provide perfect tracking while optimizing the space savings and the frequent events (e.g., counter increment and threshold test on every row access) at the expense of the more infrequent events (e.g., counters exceeding the RHT).

The aliasing avoid the large space requirements of individually tracking accesses to each row. Individually tracking accesses per DRAM row basis adds up to a large amount of storage given that the storage requirement for each row includes the bytes the user observes and the additional bytes required to count accesses adds up quickly in large (e.g., terabyte level) memory systems. Having, for example, 16 rows in a group of rows that is aliased to one counter, provides a reduction of 16× in the number of required counters. Thus, the aliasing technique in the disclosed embodiments amortize each counter over a number of rows of memory.

Figure 4:
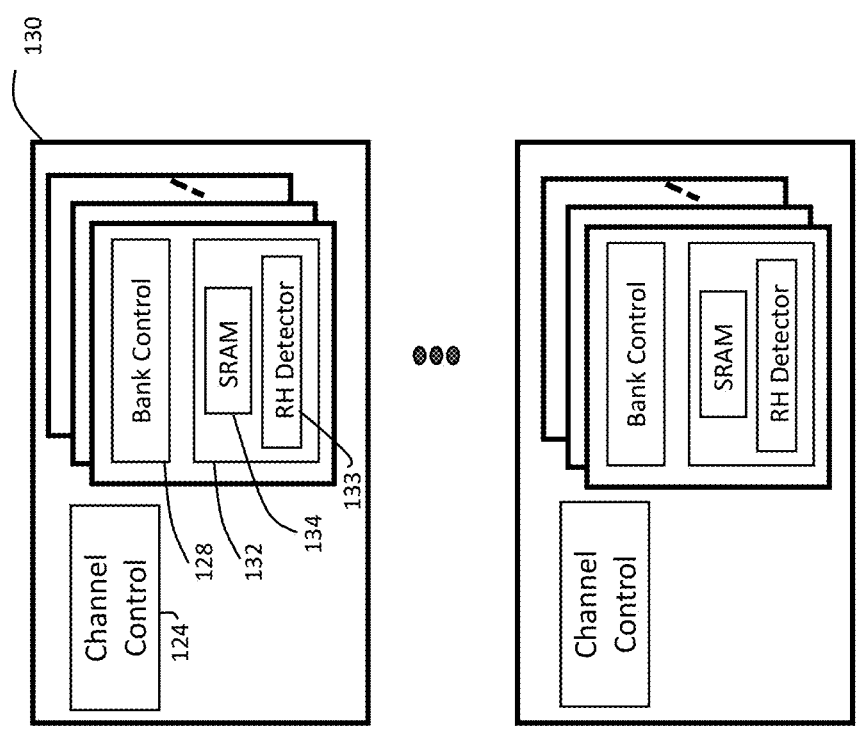
FIG. 4 illustrates a logical block diagram of a row hammer mitigation component implemented at the per-bank level, according to some embodiments.

FIG. 4 illustrates a logical block diagram of a row hammer mitigation component 132 at the per-bank level, according to some embodiments. The row hammer mitigation component 132 is replicated for each bank of the attached memory device 126 that is accessed by the memory controller 100. As shown in FIG. 1A, each media controller 120 accessing the media device 126 may have a plurality of row hammer mitigation components 132, such that each bank controlled by the channel corresponding to that media controller has a corresponding respective row hammer mitigation component 132.

The row hammer mitigation component 132 includes a row hammer detector 133 and a SRAM 134. The row hammer detector 133 includes circuitry that monitors the corresponding bank of the memory device 126 for row hammer attacks and when an attack or potential attack is detected, responds appropriately. The SRAM 134 is used by the row hammer detector 133 to maintain counters and other state associated with the row hammer detection of the corresponding bank. Additional required state associated with the row hammer detection may be maintained in d-flip flops associated with the row hammer detector 133.

The plurality of row hammer mitigation components 132, in the embodiments primarily described in this disclosure, are included in the memory controller 100. Including the row hammer mitigation circuitry, for example, the plurality of row hammer mitigation components 132, in the memory controller 100 is advantageous because all accesses to the memory devices 126 protected by the row hammer mitigation circuitry flow through the memory controller 100.

However, embodiments of this disclosure are not limited to implementing the plurality of row hammer mitigation components 132 in the memory controller 100. In some embodiments, the plurality of per-bank row hammer components 132 can be implemented externally to the memory controller. Moreover, embodiments may not be limited to storing the counters in SRAM, and in some embodiments the memory 134 may be a memory type different from SRAM but providing for serial search of the counters.

Figure 1B:
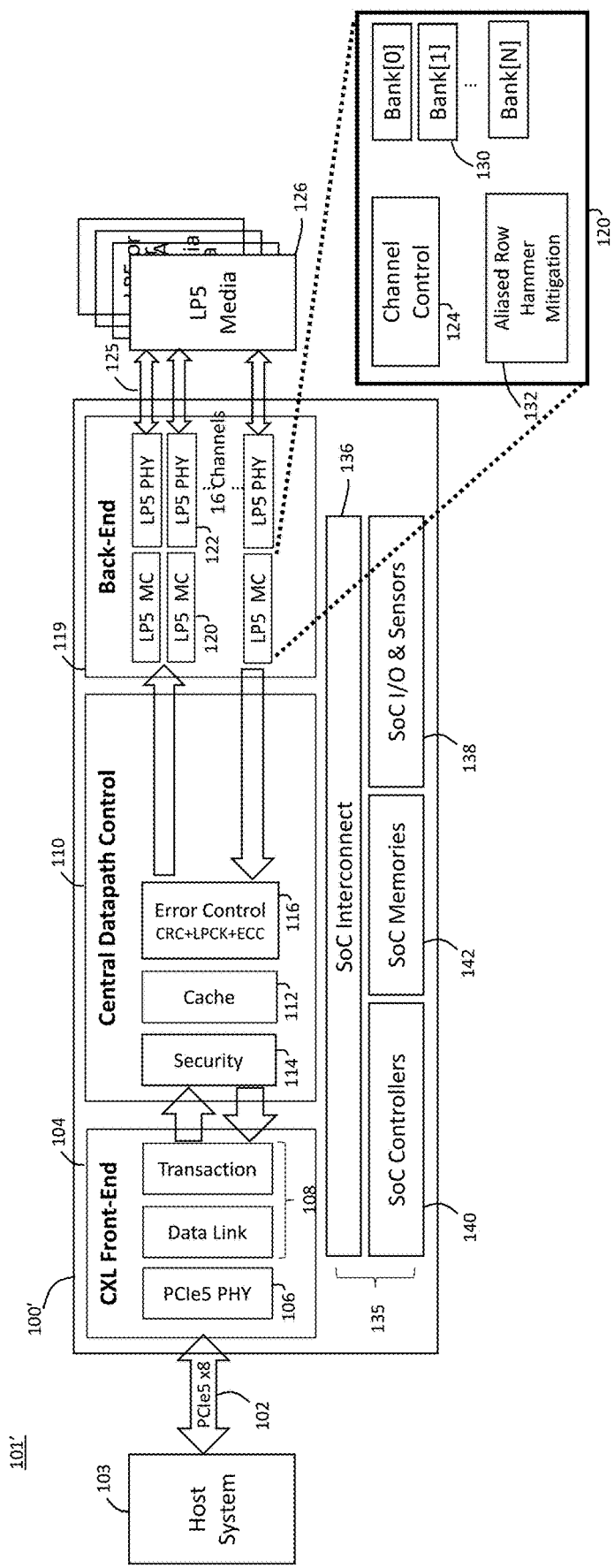
Figure 1C:
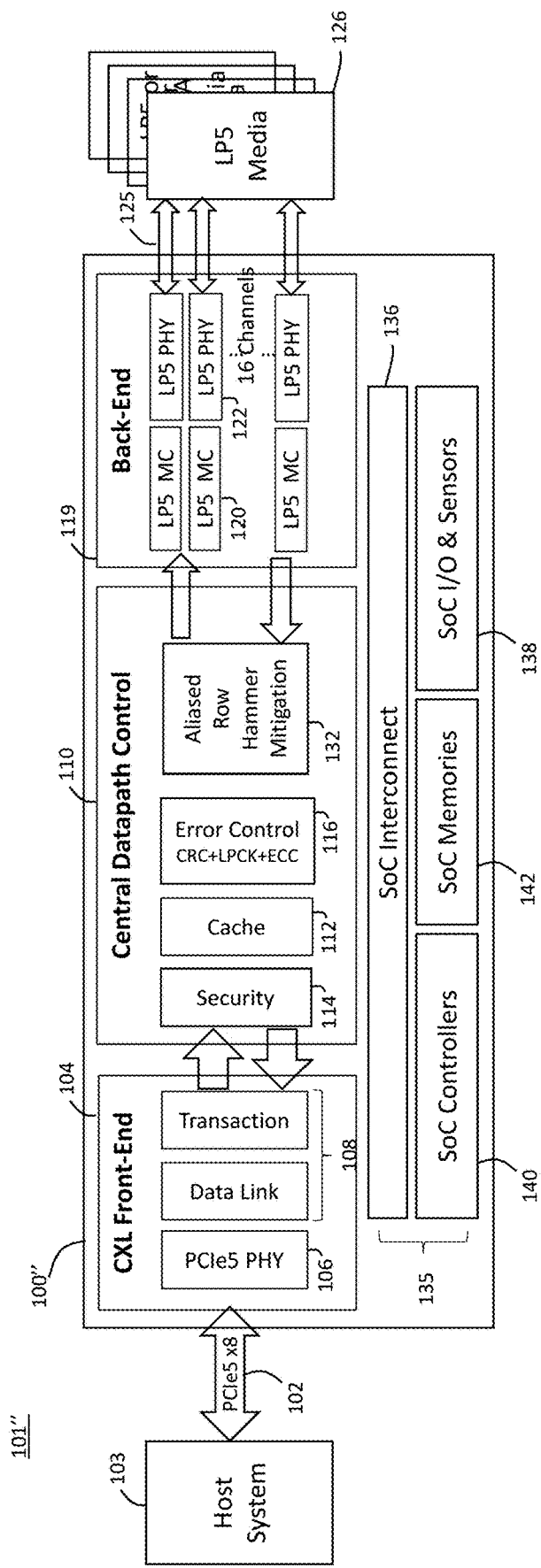

In some embodiments, the instead of implementing the row hammer detector at the per bank level as shown in FIG. 4 and FIG. 1A, the row hammer detector can be implemented at the per channel (i.e., one row hammer detector component 132 on the memory controller 100 for each channel 120, as shown, for example, in FIG. 1B) at the media device level (i.e., one row hammer component 132 on the memory controller 100 for each media device 126, as shown, for example, in FIG. 1C).

Figure 5:
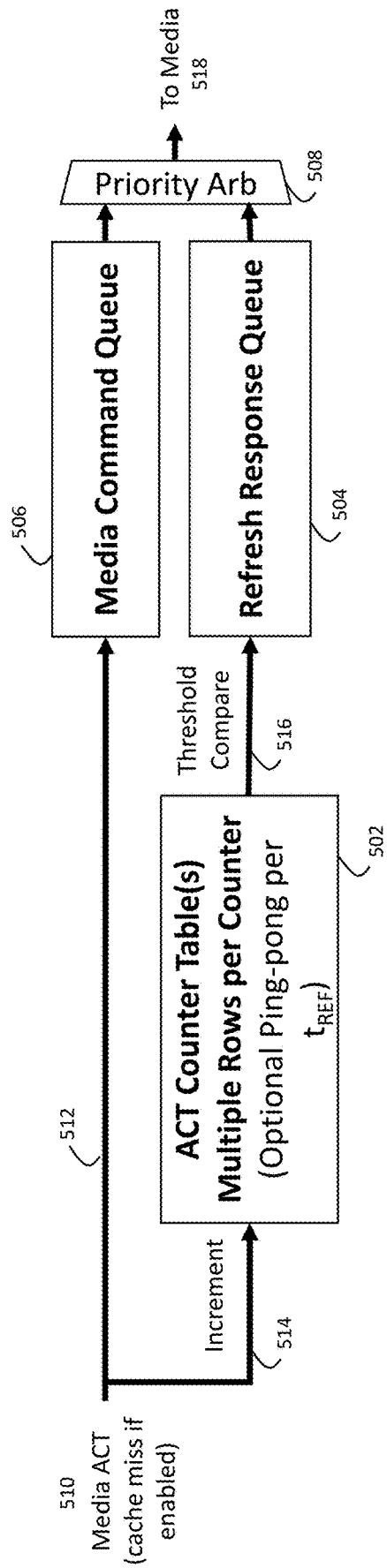
FIG. 5 schematically illustrates circuitry for row hammer mitigation using aliased row activation counters for use in an apparatus such as that shown in FIGS. 1A-1C, according to some embodiments.

FIG. 5 schematically illustrates circuitry 500 for row hammer mitigation using aliased row activation counters for use in an apparatus such as that shown in FIGS. 1A-1C, according to some embodiments. In an example embodiment, row hammer detector component 132 (see e.g., FIG. 1A and FIG. 4) includes a row activation counter (also referred to as ACT counter) circuitry 502, refresh response queue 504, media command queue 506 and priority arbiter 508.

In an example embodiment, the row hammer component 132, and thus the circuitry 500, is implemented on a memory controller 100. The circuitry 500 receives media row access commands 510 from the host system 103. Some media row access commands 510 may be generated internally to the memory controller 100 (e.g., cache 112 misses). Each media row access command 510 received in the circuitry 500 is input 512 to the media command queue 506. The media command queue 506 may be implemented as a memory buffer to store at least one media row access command before the command is provided to a media device 518 (e.g., media device 126 connected to memory controller 100 in FIG. 1A).

Each media row access command also concurrently causes the counter circuitry 502 to be incremented 514 and threshold tested 516. The tested threshold, referred to herein as the "configured triggering threshold", is set equal to the RHT or lower than the RHT (e.g., threshold=RHT−1). An efficient increment and test process is described in relation to FIG. 7. If the threshold test 516 detects that the counter has exceeded the configured triggering threshold, one or more refresh commands that provide a row hammer response are input to the refresh response queue 504.

For example, a row activation for row A (e.g., a row access to row A) causes a row activation command for row A to be enqueued in media command queue 506, and concurrently causes the counter corresponding to row A to be incremented and tested against the threshold in the circuitry 502. If the counter for row A exceeds the configured threshold, a row hammer event is detected on row A, and in response one or more refresh commands to refresh row A's adjacent rows are enqueued in the refresh response queue 506.

The priority arbiter 508 selects, from the commands enqueued in the media command queue 506 and the refresh response queue 504, commands to be sent to the memory media device 518. When the next command to be scheduled for execution in the media command queue 506 and the next command to be scheduled for execution in the refresh response queue 504 in a cycle are for the same row, the arbiter 508 may give priority to the refresh response queue 504. In this manner, the arbiter may opportunistically ensure that a row is refreshed before a next access.

In an example embodiment, if the circuitry 502 sets the configured triggering threshold at least one below the RHT (i.e., threshold=RHT−1), and an access to row A exceeds the configured triggering threshold, then that access to row A and the corresponding refresh command (generated due to the exceeding of the configured triggering threshold) may be the next command to be scheduled from command queue 506 and the refresh response queue 504, respectively. In that sequence of events, by scheduling the refresh command for row A before scheduling the row access command for row A, the priority arbiter 508 can ensure that the row access command is responded to with correct data.

In some example embodiments, the row hammer circuit component 132 includes the circuit 502, the refresh response queue 504, the media command queue 506, and the priority arbiter 508. In another embodiment, the row hammer circuit component 132 includes the circuit 502, the refresh response queue 504 and the priority arbiter 508. In another embodiment, the media command queue 506 and/or the priority arbiter 508 are implemented outside of the row hammer circuit component 132, in the media device.

Figure 6A:
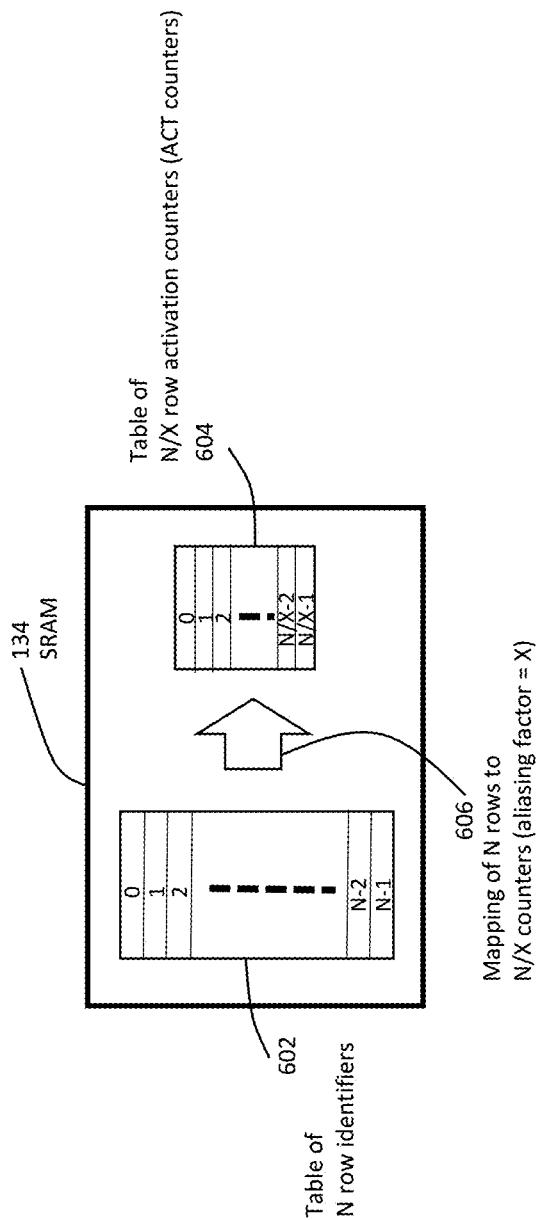
FIG. 6A schematically illustrates aliased row activation counters organized in an SRAM for use in an implementation such as that shown in FIG. 5, according to some embodiments.

FIG. 6A schematically illustrates aliased row activation counters 604 organized in an SRAM (e.g., SRAM 134 of FIG. 4) for use in an implementation such as that shown in FIG. 5, according to some embodiments. The row activation counters 604 keep track of N media rows 602 (i.e. media rows corresponding to row identifiers 0 . . . N, where n is an integer greater than 0).

The row activation counters 604 are a set of aliased counters such that each counter in the set 604 keeps track of a respectively different subset of two or more rows from the set of rows 602. A mapping 606 maps the two or more row identifiers of each subset of the rows 602 to the respectively corresponding counter of the counters 604. In some embodiments, the mapping may be selecting a counter based on a subset of bits in each row identifier. In the illustrated embodiment, the aliasing factor is X; that is, the N rows are represented by N/X counters, where X is a multiple of 2. If, for example, X=8 and N=1024, then the number of counters required is N/X=128.

FIG. 6B illustrates a table showing the effect of aliasing factors on the size of aliased row activation counter tables, according to some example embodiments. The table in FIG. 6B shows the number of counter table words for each of the aliasing factors 1, 2, 4, 8, 16, and 32, required for 128 million rows that need to be monitored. As shown in the FIG., whereas the one-to-one row-to-counter tracking (i.e., aliasing factor=1) requires more than 134 million counter table words, for an aliasing factor of 32, the number of counters required is drastically reduced to about 4 million counters.

Figure 7:
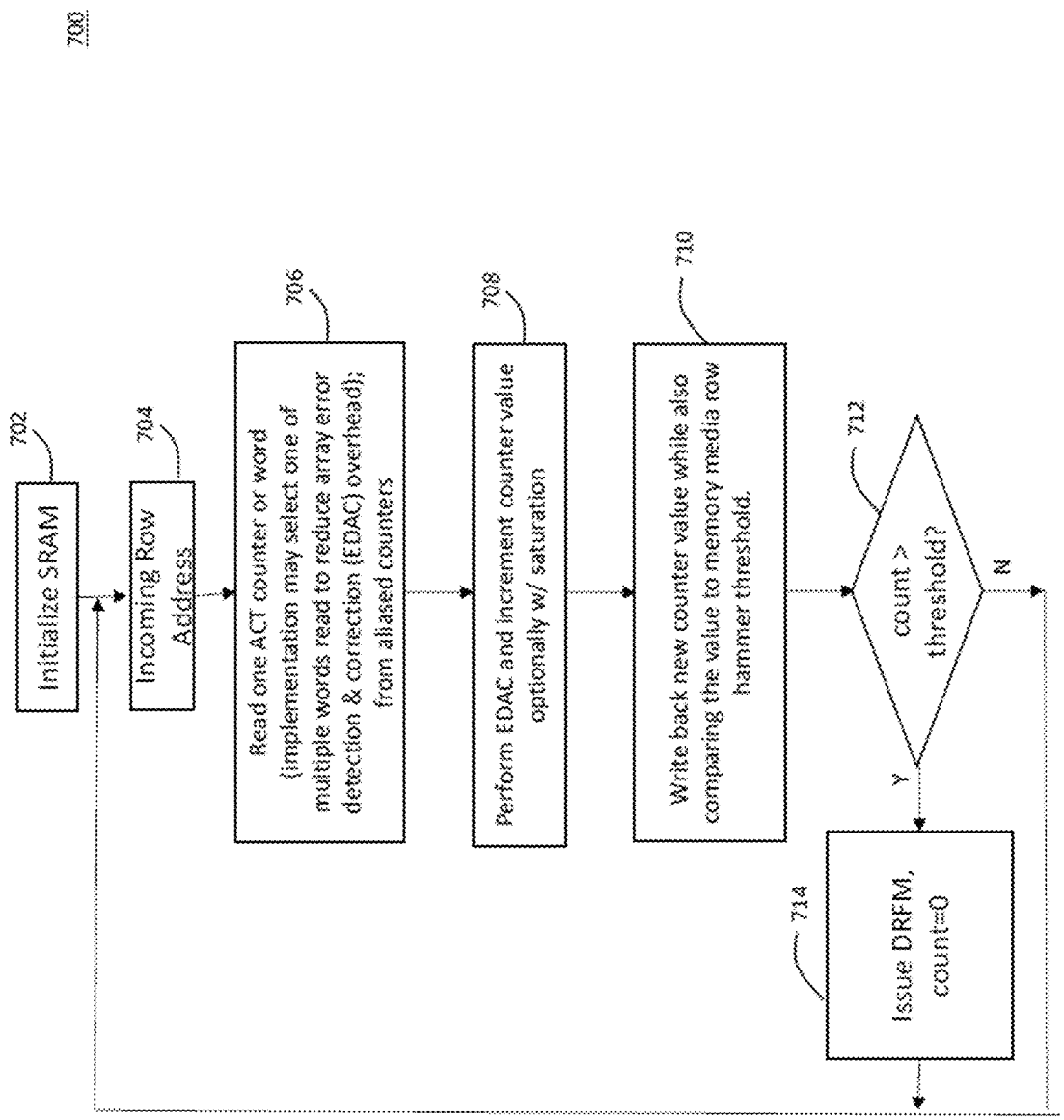
FIG. 7 shows a flowchart showing a process for row hammer mitigation using aliased row activation counter update and compare in a circuit such as that shown in FIG. 5, according to some example embodiments.

FIG. 7 shows a flowchart of a row hammer mitigation process 700 using aliased row activation counters, according to some example embodiments. The process 700 may be implemented in the row hammer mitigation component 132. According to an embodiment, in the memory controller 100, a respective row hammer mitigation component 132 corresponding to each bank of the banks connected to attached media devices 126 will have its own circuitry to independently execute process 700. FIG. 4, for example, shows a respective row hammer mitigation component 132 implemented per-bank for each of a plurality of banks in a channel. However, embodiments are not limited to per-bank row hammer mitigation. As noted above, in some embodiments, the row hammer mitigation component 132 is implemented in a per-channel manner, or in a per memory device manner.

Process 700 may begin at operation 702 during which counter tables associated with row hammer mitigation are initialized. The counter tables have an initial state, and moreover, have to be cleared periodically. This operation may be triggered/initiated, in some embodiments, in response to a ping-pong reset operation at respective refresh (tREF) intervals of the memory device 126. The reset clears out all of the row activation counters. An example ping-pong reset mechanism is described in relation to FIGS. 8A-8C. Another alternative reset technique is described in relation to FIG. 9.

At operation 704, an incoming memory media access request (row access request) is received for a particular row of the memory device 126 attached to the memory controller 100. The requested row may be referred to as the aggressor row.

At operation 706, one row activation counter, more specifically the row activation counter corresponding to the row that is to be accessed (aggressor row) in the media device, is read from SRAM 134. For example, a row activation counter from the counter table 604 is read based on the row address of the aggressor row (in row address table 602) and the aliasing mapping 606. In some examples, one counter word is read at a time for improved efficiency (e.g., implementation may select one of multiple words read to reduce array error detection & correction (EDAC) overhead).

At operation 708, EDAC is performed and the counter's value is incremented. Each increment of a counter includes incrementing the counter's value by 1. Optionally, the incrementing may be performed with saturation.

At operations 710-712, the new counter value is written back to the counter (i.e. the counter value is updated) while also comparing the value to the configured triggering threshold. In example embodiments, the configured triggering threshold is set based on the memory media RHT. For example, in one embodiment, the configured triggering threshold may be set equal to the RHT. In another embodiment, the configured triggering threshold is set equal to less than the RHT (e.g., RHT−1). Thus, operation 712 determines whether the aggressor row has been accessed too many times that it would now, or soon (e.g., in 1 or a few more access), potentially corrupt adjacent rows.

If it is determined at operation 712 that the aggressor row has been accessed more than the configured triggering threshold, then at operation 714 a response, such as a signal commanding the memory device to refresh (e.g., DRFM command) an identified aggressor row's victim rows is transmitted to the memory device. In some embodiments, the memory device includes circuitry to receive an aggressor row ID and, in response, refresh victim rows. In some embodiments, the response may identify the victim rows to be refreshed.

During operation 714, the count value corresponding to the aggressor row ID is set to 0 because the victim rows of the aggressor row have been refreshed in response to the transmitted response. In some embodiments, the counter values for the victim rows may also be reset to reflect that they are refreshed in the memory device.

If it is determined at operation 712 that the aggressor row's counter did not exceed the configured triggering threshold, process 700 returns to operation 704 to wait for the next row identifier. Alternatively, at the end of operation 714, process 700 returns to operation 704 to wait for the next row identifier.

It should be noted that process 700 can be implemented in a manner that highly optimizes the most frequent case of updating and comparing counters. For example, in an example embodiment, each of the operations 706 (reading an aliased counter value), 708 (incrementing the value of the counter) and 710 (updating the counter in SRAM and comparing to the configured triggering threshold) at the rate of one clock cycle each, yielding a three clock cycles time for completing operations 706-710.

As mentioned above, in normal operation scenarios, it is relatively rare that the row hammer threshold is exceeded.

But in example embodiments, due to the row activation counters being aliased, the configured triggering threshold (that is configured based on the RHT) may be exceeded somewhat more often but is still expected to occur only rarely compared to the above noted more frequent update and compare events, and thus not negatively affect performance.

Figure 8A:
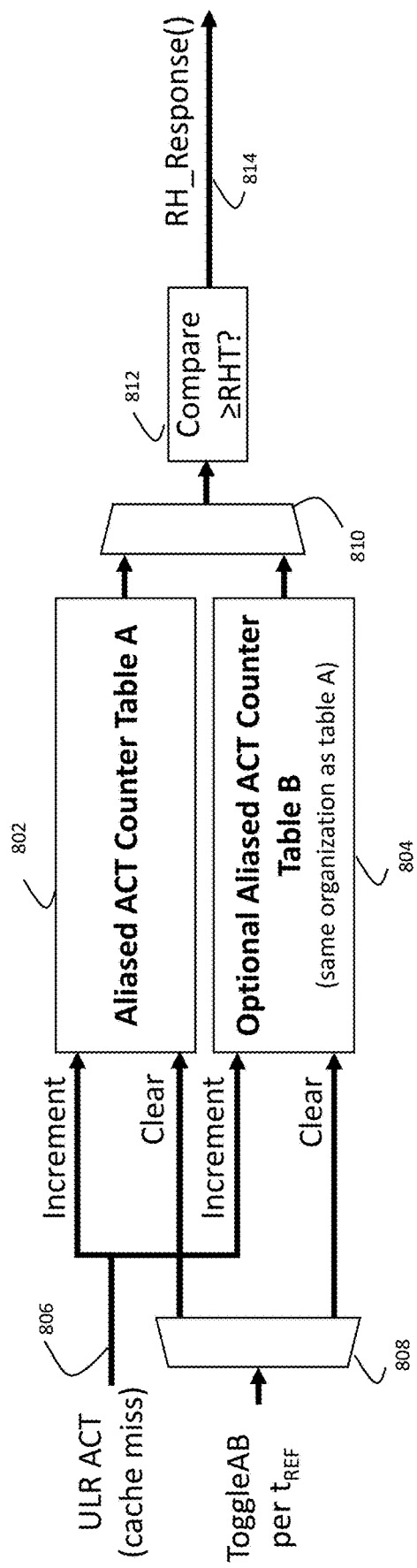
FIGS. 8A-8C show a ping-pong implementation to initialize the aliased row activation counters in a row hammer mitigation implementation such as that shown in FIG. 5, according to some example embodiments.
Figure 8B:
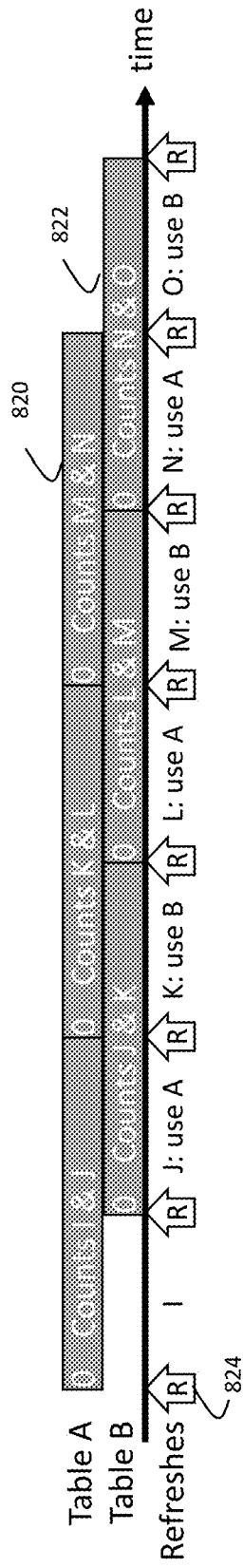
Figure 8C:
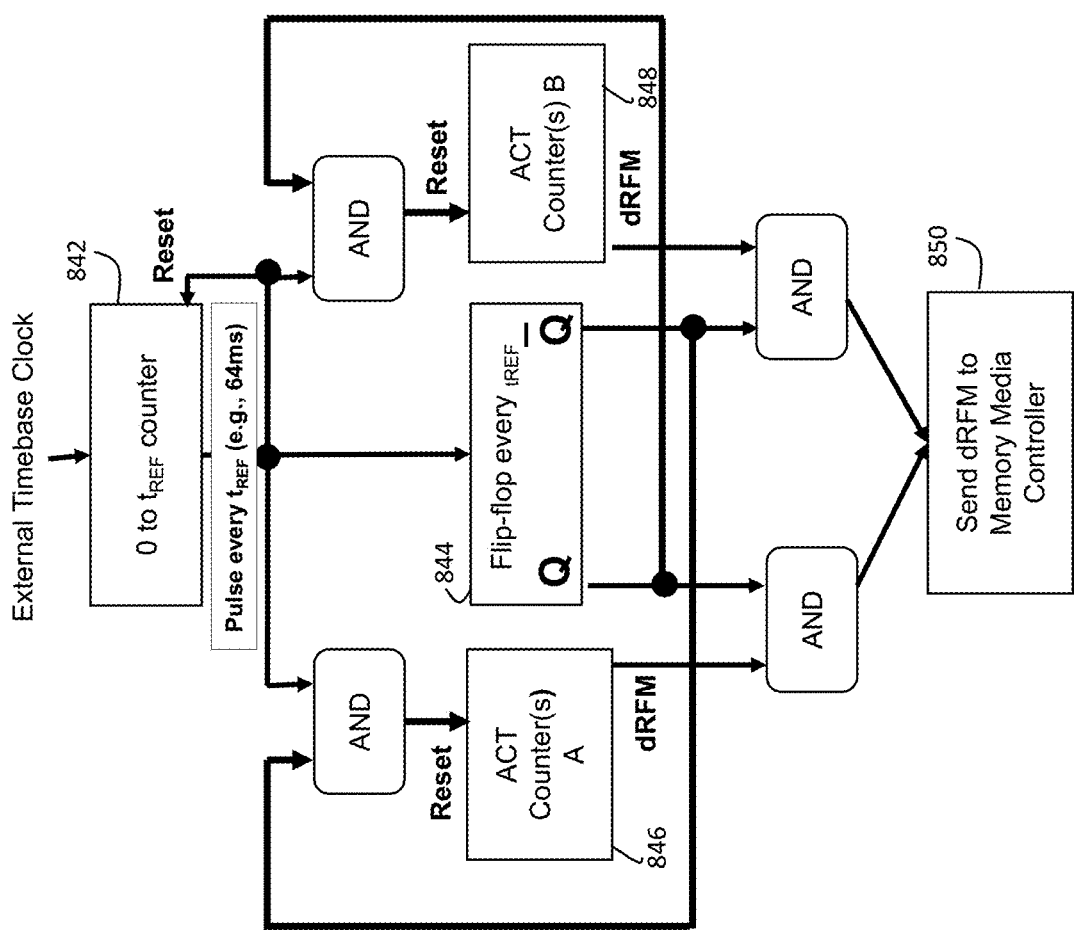

FIGS. 8A-8C shows a ping-pong implementation to initialize the aliased row counters in an aliased counter row hammer mitigation implementation such as that described in relation to FIG. 5 and FIG. 7, according to some example embodiments.

Any counter-based logic needs reset. Because different memory media rows refresh at different internal media determined times, the ideal time to reset an external counter for a particular media row may be configurable or determined at boot time. Periodic ping-pong reset is a safe counter reset that is possible when paired counters are used in a ping-pong scheme. The time between resets of any particular counter may be configurable, and is e.g., 128 ms (2×tREF) in some embodiments. According to an embodiment, during a first tREF period the ACT counter(s) is in preconditioning state where it is counting but not sending DRFM. During the next tREF period the ACT counter(s) is counting as well as triggering DRFM command(s) or other row hammer response.

A second set of ACT counter(s) operates similarly but is offset by tREF from the first set of ACT counter(s). One set of ACT counters is always active to trigger DRFM commands.

This approach eliminates false negative DRFM triggers. However, this approach requires two sets of counters, meaning twice the silicon area and the power. Moreover, there is the potential DRFM is sent based on counts from 2×tREF.

FIG. 8A illustrates an example high level schematic illustration of a ping-pong reset scheme using two aliased counter tables—table A 802 and table B 804. Both aliased row activation counter tables 802 and 804 may have the identical structure and counters for the same rows.

When an increment event 806 is received for an aggressor row, the counter corresponding to the aggressor row is identified using the aliasing 606 and the corresponding counter is updated in each of the tables 802 and 804. Although both tables are continually updated for each incoming operation, at any given time one of the tables is considered the active table. For the compare 810 to the configured triggering threshold, the value of the aggressor row counter is selected from the active table at the time. Based on the result of the compare 810, a row hammer response 812 may be issued as described above in relation to operation 714.

The row activation counter tables 802 and 804 are referred to as ping-pong because the active table status alternates between the two tables. At regular time intervals, a reset circuit 808 resets all counters in one of the tables 802 or 804. The most recently reset table operates as the backup table, while the other operates as the active table.

FIG. 8B illustrates the table update procedure during a time period including a plurality of refresh periods 824 identified as period I-O. The time staggered manner in which table A is updated (sequence of operations 820) and table B is updated (sequence of operations 822) is illustrated. For clarity of explanation, the sequence 820 is shown as starting before sequence 822 to represent that the i-th reset of table A occurs in a time staggered manner at one refresh interval 824 before that i-th reset of table B. The bottom line in the illustration indicates the which table is considered as the active table at each refresh interval I-O.

FIG. 8C shows a schematic of a ping-pong reset circuit 840 according to some embodiments. An external clock serves as input to the circuit 840. Based on the input clock, a 0 to tREF counter 842 generates a pulse every tREF (e.g., 64 ms). Based on the pulse from counter 842 a flip-flop 844 toggles output between 0 and 1 every tREF. ACT Counter(s) A 846 is reset when ACT Counter(s) B 848 becomes active (i.e., able to trigger DRFM) and vice versa.

Both ACT counter(s) A 846 and ACT counter(s) B 848 always receive and count all memory media row activations (ACTs). Both ACT counter(s) A and ACT counter(s) B trigger DRFM (or other row hammer mitigation response) when they reach the memory media RI-1T count (or the configured triggering threshold), but based on the state of the flip-flop 844, only the one of the ACT counters that is "active" can trigger a DRFM, the other ACT counter(s) is ignored. Component 850 generates the DRFM to the memory media controller to be transmitted to the memory device.

Figure 9:
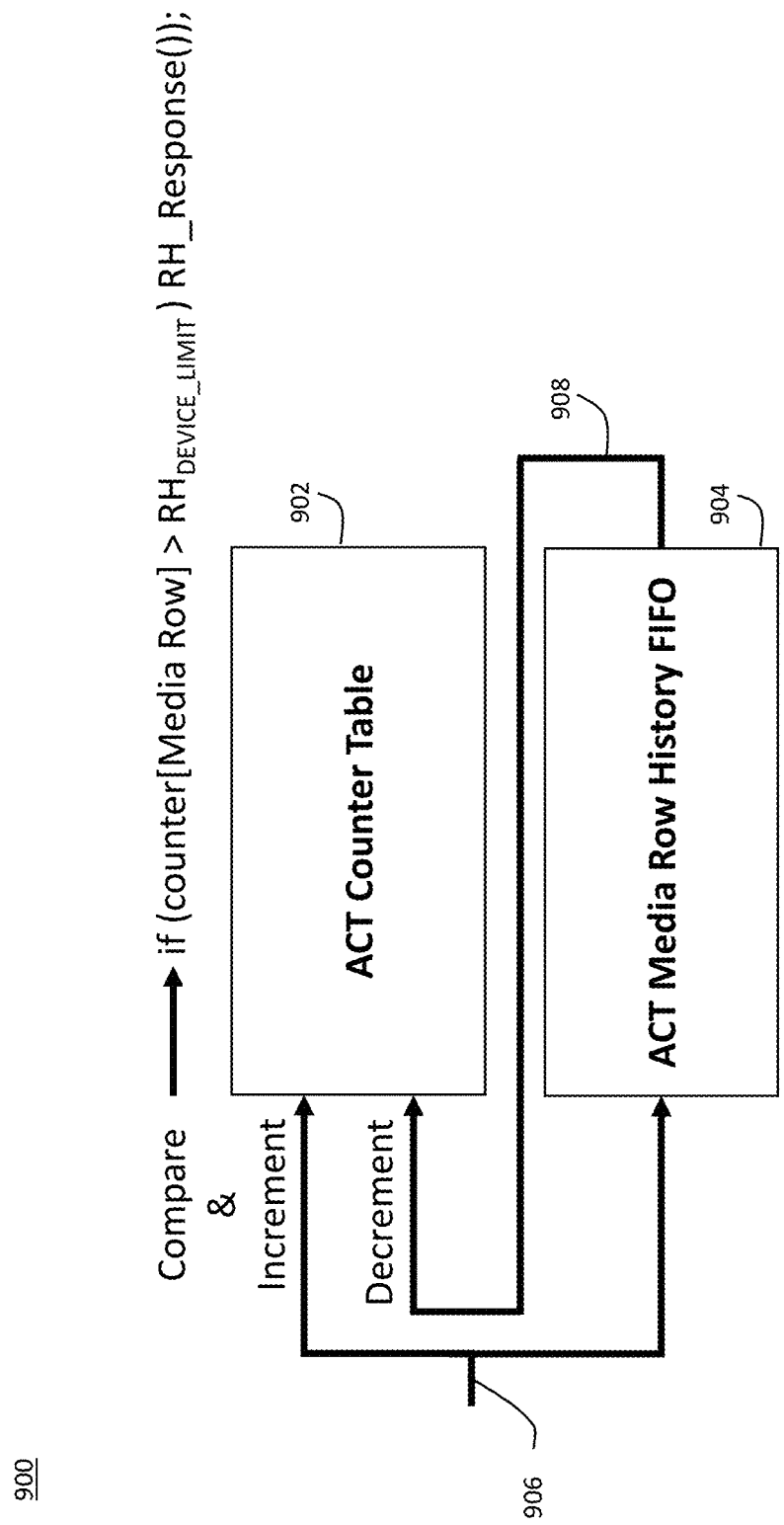
FIG. 9 shows another implementation to initialize the aliased row activation counters in a row hammer mitigation implementation such as that shown in FIG. 5, according to some example embodiments.

FIG. 9 shows an alternative reset circuit 900 that can safely reset the ACT counters 604 without doubling the size of the space consumed by the counter tables as required for the ping-pong reset circuit 840. According to an embodiment, the reset circuit 900 includes an ACT media row history FIFO 904 based on which the ACT row counters 902 (e.g., aliased row counters 604) are reset.

In operation, when a counter increment and compare to the configured triggering threshold occurs 916 (e.g., operation 710 in process 700 above) for a row A, concurrently with the updating of the counter for row A in the aliased ACT counters 902, a row A identifier is pushed into the FIFO 904. Similarly, for each counter update, the corresponding row identifier is pushed into the FIFO 904. When the FIFO is full, the earliest row identifier is popped. For each row identifier that is popped from the FIFO 904, the corresponding row counter in aliased row counters 902 is reset.

After refresh command for a row, a row activation count for that row is 0. The problem, however, is that the memory controller may not know which rows were refreshed when. All the memory controller may know is whether a Tref has gone by since a last refresh. One naïve solution is to, upon each refresh, the row identifier is pushed in the FIFO. Eventually (e.g., after 60 seconds), that row identifier is popped and the row is refreshed again.

FIG. 10 illustrates a table of different row hammer attack response techniques that can be implemented in example embodiments. The refresh techniques include bias cache replacement, increased refresh, ACT/Pre neighbor rows, poor man's dRFM, dRFM, EDAC scrub neighbors, throttling row activations to CRHA rows (e.g., rows with high row activation counts), responding to the row access request with a Data Bad message, alerting and/or interrupting the host to indicate that the RHT has been exceeded. As illustrated in the table, several of the response techniques guarantee data integrity and also do not require the media device's repair map. Guarantee of data integrity increases the reliability of data read from the media device. Not requiring the repair map increases the flexibility of the response technique, and also the applicability of the response techniques to media devices from different manufacturers etc. As can be seen in FIG. 10, dRFM guarantees data integrity, does not require the media device's repair map, and has a low response time, indicating it as a response technique that can be used efficiently in example embodiments. However, embodiments are not limited to using dRFM as the response to row hammer attacks.

SRAM implementation of the row activation counters, and optionally the aliasing index from row identifier to counter, for use in row hammer detection makes the aliased row activation counter algorithm efficient in relation to the amount of circuit space required and energy use. The disclosed row hammer detector implementations, in some embodiments, use single-port SRAM(s). Single-port SRAM can be read or written, but not both, at a time, and is a cheaper form of SRAM. Since, as noted above, the operations 706-710 can be completed in very few clock cycles, a previous access request for the memory media device can be completed before beginning to act on the next access request for that memory media device, thus enabling the use of a single-post SRAM which allows a read or a write at a given time, but not both. SRAM implementation of the bulk of the state required by the algorithm makes it practical for row hammer detection to be performed within a controller for a large quantity of memory media and that in-turn enables row hammer detection functions to be removed from the controlled memory media, simplifying and reducing the cost and power consumption of that memory media.

As noted above, example embodiments optimize the more frequent event associated with row hammer mitigation, that is the updating and comparing of row activation counters, as opposed to the rarer event (under normal operating circumstances) of the row activation counter values exceeding the memory media device's RHT. As described above, for example, the updating and comparing of a row activation counters can be performed in three clock cycles in some embodiments, while the response to a detected row hammer attack can take multiple clock cycles.

Aliased row activation counters as implemented in example embodiments are simple, power efficient, and reasonably space efficient. But in some embodiments, the system ends up having to do more mitigation action than in implementations with an individual counter per row, because each counter in embodiments is common to several rows. Mitigation commands are generally time-consuming, and RHT can be reached up to multiple times (e.g., up to the aliasing factor) faster. Also, whenever RHT is exceeded, the number of mitigation messages sent is more (i.e., more rows in the group means more neighbors). The reasoning is that, under normal operating conditions, no group of rows should have its counter exceeded, and therefore mitigation is rarely triggered. Example embodiments are directed to detecting an exceptional case cheaply. But since row hammer attacks can happen, a secondary goal of example embodiments is to, when a row hammer attack is detected, minimize impact on performance.

Additionally, upon detection of a row hammer attack in an example embodiment, more row hammer response refresh messages may be sent to the memory media device than in an implementation which has an individual counter per row. Although having more than one row associated with the counter that exceeded RHT does not necessary mean that the number of affected rows (i.e., number of adjacent rows) are greater than in the case of one row per counter implementations, an example embodiment may generate a refresh response for each of the rows associated with the counter because the memory controller may not have knowledge of the memory media device's mapping of row identifiers to the actual physical row layout.

The efficiency of aliasing groups in example embodiments may be improved by having the aliasing groups overlap with the refresh groups. For example, a memory media device may be configured to perform refresh of all its rows by refreshing a respectively different group of the rows at each of a plurality of refresh times. When the aliasing groups (the respectively different subgroups of rows mapped to each row activation counter) overlap with the refresh groups, the counting process is optimized because all the rows in each group have the same refresh interval.

Example embodiment can limit waterfall and domino attacks in which an attacker might corrupt a user's data by setting the row updates such that several adjacent groups come to be just below the configured triggering threshold so that when one exceeds the threshold, the mitigation to that might cause another group to exceed the threshold, and so on, causing waterfall and domino attacks.

Moreover, in example embodiments, the worst-case denial of service (DoS) latency impact to subsequent memory access can be limited to only the duration required by one row hammer response by ensuring that configured triggering threshold is less than the RHT so that the media row is always refreshed just before the media access request that would exceed the RHT is received.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "transmit", "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components.

In some examples, the flow of signals between the connected components may be interrupted for a time, for example, using one or more intermediate components such as switches or transistors. The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium.

For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

DRAM is organized as an array of storage cells with each cell storing a programmed value. As noted above, the cells can lose their programmed values if not periodically refreshed. Thus, the rows are refreshed at a fixed interval often referred to as the "refresh interval". The refresh is also called a "row activation". In a row activation, a row in the DRAM device is read, error corrected and written back to that same physical row. Data corruption caused by "row hammer events" (also referred to as "row hammer attacks") are a significant risk in recent DRAM devices.

A row hammer event occurs when a particular row in a media device is accessed too many times, that is, more than a "row hammer threshold" (RHT) number of times, in an "activation interval" (i.e., the interval between two refresh/activation events). Specifically, when a particular row (an "aggressor row") is accessed more than a RHT number of times during an activation interval, one or more rows ("victim rows") that are physically proximate to that particular row in the DRAM media can be affected as a result of the frequent activation of the particular row, and data corruption of the one or more rows may occur.

Due to various physical effects of shrinking manufacturing process geometries, the RHT of memory devices has decreased to a level at which even normal computer system programs can inadvertently corrupt their own data or the data of another program sharing the same system's memory. Conventional row hammer detection techniques are either practical but imperfect allowing data corruption or severe performance degradation, or perfect but impractically costly in required resources.

Conventional row hammer detector algorithms, such as "Address Sampling" and "Priority CAM" (priority content addressable memory) are probabilistic and thus cannot guarantee perfect (i.e., complete, accurate, and precise) prevention of data corruption in any and all row hammer scenarios. If an aggressor (e.g., a malicious attacker) knows sufficient details of these conventional row hammer detection methods and their implementation, the aggressor can attack their weaknesses to bypass or break them and corrupt data.

The "direct" or "perfect" row tracking method, in which a counter is maintained for each row in the DRAM media, is a known perfect row hammer detection algorithm, but its implementation requires both amounts of memory and operating power that are too high to be practically useful.

Guaranteed row hammer event elimination is compelling for any memory device, but is especially compelling for systems such as, for example, hyperscale datacenters (HSDC). In HSDCs, typically multiple customers share processors and memory. A malicious attacker can use row hammer attacks to silently (e.g., without detection) corrupt other customers' data to possibly escalate its privilege to take control of more system resource or compromise data center security.

Currently row hammer corruption is indistinguishable from other soft errors. Modern workloads thrash processor caches and cause unintentional row hammer scenarios. Detected errors beyond a threshold rate require physical service of the dual in-line memory modules (DIMMs) which are often returned to the supplier for credit.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a memory media device interface configured to connect to a memory media device;
    at least one memory comprising a plurality of counters and a plurality of rows enabled for data storage in the memory media device, wherein each counter of the plurality of counters is (i) associated with a group of rows of the plurality of rows and (ii) configured to keep a count of a number of times each row within its respective group of rows of the plurality of rows has been accessed; and
    a first circuit that is configured to perform operations comprising:
        reading, based on a row identifier of a memory media access request, a counter in the plurality of counters;
        incrementing a count value of the counter;
        when the incremented count value exceeds a configured triggering threshold, triggering a response to an error in the memory media device; and
        writing the incremented count value to the counter.

2. The apparatus according to claim 1, wherein the at least one memory is a static random access memory (SRAM).

3. The apparatus according to claim 2, wherein the apparatus uses a single-port SRAM.

4. The apparatus according to claim 1, wherein a total number of counters in the plurality of counters is less than a total number of rows monitored by a memory error detector on the memory media device.

5. The apparatus according to claim 1, wherein each said respective group of rows enabled for data storage in the memory media device comprises the plurality of rows.

6. The apparatus according to claim 5, wherein each said respective group of rows enabled for data storage in the memory media device comprises a same number of rows.

7. The apparatus according to claim 1, wherein the reading, the incrementing and the writing are collectively performed in three consecutive clock cycles.

8. The apparatus according to claim 1, further comprising a second circuit, wherein the second circuit is configured to receive first requests to be transmitted to the memory media device and second requests to be transmitted to the memory media device, and to select from the first requests and the second requests a request to transmit to the memory media device, wherein the first requests are requests to read or write data and the second requests are requests to refresh one or more rows in the memory media device.

9. The apparatus according to claim 8, wherein the second circuit is configured to, when a first request and a second request are associated with a same row, select the second request.

10. The apparatus according to claim 1, wherein the configured triggering threshold is configured to a value lower than a row hammer threshold value of the memory media device.

11. The apparatus according to claim 1, wherein the at least one memory comprises a second plurality of counters, wherein a total number of counters in a first plurality of counters and the second plurality of counters are same, and wherein the first circuit is further configured to, in response to the memory media access request, increment values in corresponding counters of the first plurality of counters and the second plurality of counters, and perform resetting of the first plurality of counters in a time staggered manner in relation to resetting the second plurality of counters.

12. The apparatus according to claim 1, wherein the at least one memory comprises a first-in-first-out queue having a total number of queue entries that is equal to a total number of counters in the plurality of counters, and the first circuit is further configured to, in response to resetting each counter of the plurality of counters, input a corresponding counter identifier in the first-in-first-out queue, and, in response to each counter identifier output from the first-in-first-out queue, reset a corresponding counter in the plurality of counters.

13. The apparatus according to claim 1, wherein the triggered response comprises a digital refresh management (DRFM) command to refresh one or more physically adjacent rows of a row corresponding to the row identifier.

14. The apparatus according to claim 1, wherein the first circuit is further configured to clear the plurality of counters at respective refresh interval of the memory media device.

15. The apparatus according to claim 14, wherein all rows in each said respective group of rows are refreshed in a same refreshed interval.

16. A method comprising:
configuring a plurality of counters in at least one memory, wherein each counter of the plurality of counters is (i) associated with a group of rows of a plurality of rows enabled for data storage in a memory media device and (ii) configured to keep a count of a number of times each row within its respective group of rows of the plurality of rows has been accessed;
reading, by a first circuit and based on a row identifier of a memory media access request, a counter in the plurality of counters;
incrementing, by the first circuit, a count value of the counter;
when the incremented count value exceeds a configured triggering threshold, triggering, by the first circuit, a response to an error in the memory media device; and
writing, by the first circuit, the incremented count value to the counter.

17. The method according to claim 16, wherein the at least one memory is a static random access memory (SRAM).

18. A system comprising:
a host system;
a memory media device; and
a memory controller, comprising:
a first interface configured to connect the host system;
a second interface configured to connect to the memory media device;
at least one memory comprising a plurality of counters and a plurality of rows enabled for data storage in the memory media device, wherein each counter of the plurality of counters is (i) associated with a group of rows of the plurality of rows and (ii) configured to keep a count of a number of times each row within its respective group of rows of the plurality of rows has been accessed; and
a circuit configured to perform operations comprising:
reading, based on a row identifier of a memory media access request, a counter in the plurality of counters;
incrementing a count value of the counter;
when the incremented count value exceeds a configured triggering threshold, triggering a response to an error in the memory media device; and
writing the incremented count value to the counter.

19. The system according to claim 18, wherein the at least one memory is a static random access memory (SRAM).

* * * * *